(12) United States Patent
Dykaar

(10) Patent No.: US 9,396,932 B2
(45) Date of Patent: Jul. 19, 2016

(54) METHOD OF FABRICATING CRYSTALLINE ISLAND ON SUBSTRATE

(71) Applicant: DIFTEK LASERS, INC., Waterloo (CA)

(72) Inventor: Douglas R. Dykaar, Waterloo (CA)

(73) Assignee: DIFTEK LASERS, INC., Waterloo, Ontario (CA)

( * ) Notice: Subject to any disclaimer, the term of this patent is extended or adjusted under 35 U.S.C. 154(b) by 0 days.

(21) Appl. No.: 14/610,567

(22) Filed: Jan. 30, 2015

(65) Prior Publication Data

US 2015/0357192 A1 Dec. 10, 2015

Related U.S. Application Data

(60) Provisional application No. 62/007,624, filed on Jun. 4, 2014.

(51) Int. Cl.
| | |
|---|---|
| *H01L 21/02* | (2006.01) |
| *C30B 11/00* | (2006.01) |
| *C30B 29/06* | (2006.01) |
| *H01L 27/32* | (2006.01) |

(52) U.S. Cl.
CPC .......... *H01L 21/0243* (2013.01); *C30B 11/002* (2013.01); *C30B 11/003* (2013.01); *C30B 29/06* (2013.01); *H01L 21/02532* (2013.01); *H01L 21/02667* (2013.01); *H01L 27/32* (2013.01)

(58) Field of Classification Search
CPC .............. H01L 27/32; H01L 21/76232; H01L 21/0243
See application file for complete search history.

(56) References Cited

U.S. PATENT DOCUMENTS

| | | |
|---|---|---|
| 4,430,150 A | 2/1984 | Levine et al. |
| 4,479,847 A | 10/1984 | McCaldin et al. |
| 4,637,855 A | 1/1987 | Witter et al. |

(Continued)

FOREIGN PATENT DOCUMENTS

| | | |
|---|---|---|
| EP | 2099064 A1 | 9/2009 |
| WO | 2008057483 A2 | 5/2008 |
| WO | 2013053052 A1 | 4/2013 |

OTHER PUBLICATIONS

European Patent Application No. 15153173.8 Partial Search Report dated Aug. 26, 2015.

(Continued)

*Primary Examiner* — Yu-Hsi D Sun
(74) *Attorney, Agent, or Firm* — Perry + Currier, Inc.

(57) ABSTRACT

Certain electronic applications, such as OLED display back panels, require small islands of high-quality semiconductor material distributed over a large area. This area can exceed the areas of crystalline semiconductor wafers that can be fabricated using the traditional boule-based techniques. This specification provides a method of fabricating a crystalline island of an island material, the method comprising depositing particles of the island material abutting a substrate, heating the substrate and the particles of the island material to melt and fuse the particles to form a molten globule, and cooling the substrate and the molten globule to crystallize the molten globule, thereby securing the crystalline island of the island material to the substrate. The method can also be used to fabricate arrays of crystalline islands, distributed over a large area, potentially exceeding the areas of crystalline semiconductor wafers that can be fabricated using boule-based techniques.

25 Claims, 16 Drawing Sheets

(56) References Cited

U.S. PATENT DOCUMENTS

| | | | |
|---|---|---|---|
| 5,431,127 | A | 7/1995 | Stevens et al. |
| 6,316,278 | B1 | 11/2001 | Jacobsen et al. |
| 6,440,785 | B1 | 8/2002 | Yamazaki et al. |
| 7,078,275 | B2 | 7/2006 | Hiroshima et al. |
| 8,088,676 | B2 | 1/2012 | Wong et al. |
| 8,846,505 | B2 * | 9/2014 | Einav ............... H01L 21/02422 117/16 |
| 8,999,742 | B1 * | 4/2015 | Lowenthal ...... H01L 31/035209 264/104 |
| 9,067,792 | B1 * | 6/2015 | Hariharan ............... C01B 33/02 |
| 9,209,019 | B2 * | 12/2015 | Dykaar ............. H01L 21/02422 |
| 9,224,851 | B2 * | 12/2015 | Dykaar ............... H01L 21/0243 |
| 2006/0148166 | A1 | 7/2006 | Craig et al. |
| 2012/0067273 | A1 | 3/2012 | Sachs et al. |

OTHER PUBLICATIONS

Drevet B et al: "Wetting, infiltration and sticking phenomena in Si3N4 releasing coatings in the growth of photovoltaic silicon", Solar Energy Materials and Solar Cells, Elsevier Science Publishers, Amsterdam, NL, vol. 94, No. 3, Mar. 2010, pp. 425-431, XP026878452, ISSN: 0927-0248 [retrieved on Nov. 28, 2009].

Itoh Hironori et al: "In situ observation of melting and crystallization of Si on porous Si3N4substrate that repels Si melt", Journal of Crystal Growth, Elsevier, Amsterdam, NL, vol. 401, Mar. 12, 2014, pp. 359-363, XP029040773, ISSN: 0022-0248. DOI: 10.1016/J.JCRYSGRO.2014.02.044.

Ishihara, Ryoichi, et al., "Solution Processed Single-Grain Si TFTs on a Plastic Substrate", SID Symposium Digest of Technical Papers, vol. 45, Issue 1, pp. 439-442, Jun. 2014 (Article first published online: Jul. 7, 2014).

Kugimiya, K., et al., "101-Stage 2 µm Gate Ring Oscillators in Laser-Grown Silicon Islands Embedded in SiO2", IEEE Electron Device Letters, p. 270-272, vol. EDL-3, No. 9, Sep. 1982.

Scharff, W., et al., "Growth of Monocrystalline Silicon Islands on Insulating Substrates", Thin Solid Films, 113(1984) 327-335.

Li, Jian-Guo, "Wetting of Ceramic Materials by Liquid Silicon, Aluminium and Metallic Melts Containing Titanium and Other Reactive Elements: A Review", Ceramics International 20 (1994) 391-412, 1994.

van der Wilt, Paul Ch., et al. "Formation of Location-Controlled Crystalline Islands Using Substrate-Embedded Seeds in Excimer-Laser Crystallization of Silicon Films", Applied Physics Letters 79, 1819 (2001);view online: http://dx.doi.org/10.1063/1.1402641, published by AIP Publishing.

Henke, Thomas, et al., "Formation of Regularly Arranged Large Grain Silicon Islands by Using Embedded Micro Mirrors in the Flash Crystallization of Amorphous Silicon", Journal of Applied Physics 115, 034301 (2014); view online: http://dx.doi.org/10.1063/1.4861398, published by AIP Publishing.

Matsuki, Nobuyuki, et al., "Investigation of Local Electrical Properties of Coincidence-Site-Lattice Boundaries in Location-Controlled Silicon Islands Using Scanning Capacitance Microscopy", Applied Physics Letters 93, 062102 (2008); view online: http://dx.doi.org/10.1063/1.2968663, published by AIP Publishing.

Zhang, J., et al., "Single-Grain Si Thin-Film Transistors on Flexible Polyimide Substrate Fabricated From Doctor-Blade Coated Liquid-Si", Applied Physics Letters 102, 243502 (2013); view online: http://dx.doi.org/10.1063/1.4811356.

Chen, Tao, et al., "Location- and Orientation-Controlled (100) and (110) Single-Grain Si TFTs Without Seed Substrate", IEEE Transactions on Electron Devices, p. 2348-2352, vol. 57, No. 9, Sep. 2010.

Imanaka, Yoshihiko, "Multilayered Low Temperature Cofired Ceramics (LTCC) Technology", Chapter title: Printing and Laminating, pp. 145-166, (2005) Springer US.

Extended European Search Report dated Jan. 15, 2016 for European Patent Application No. 15153173.8.

Liu et al: "A concentrator module of spherical Si solar cell", Solar Energy Materials and Solar Cells, Elsevier Science Publishers, Amsterdam, NL, vol. 91, No. 19, Sep. 14, 2007, pp. 1805-1810, XP022245075, ISSN: 0927-0248, DOI:10.1016/J.SOLMAT.2007.06.008 *figure 3*.

* cited by examiner

__US 9,396,932 B2__

METHOD OF FABRICATING CRYSTALLINE ISLAND ON SUBSTRATE

CROSS-REFERENCE TO RELATED APPLICATION

This application claims priority from U.S. Provisional Patent Application No. 62/007,624, filed on Jun. 4, 2014, which is incorporated herein by reference.

FIELD OF THE INVENTION

The present invention relates to a method of fabricating one or more crystalline islands of an island material abutting a substrate.

BACKGROUND OF THE INVENTION

Certain electronic applications, such as OLED display back panels, require small islands of high-quality semiconductor material distributed over a large area. This area can be 50 inches diagonally and larger, and exceeds the sizes of crystalline semiconductor wafers that can be fabricated using the traditional boule-based techniques.

WO 2013/053052 A1, incorporated herein by reference, discloses fabricating a large number of small, loose, crystalline semiconductor spheres. The spheres are then distributed on a patterned substrate and affixed to the substrate at predetermined locations to form an array of spheres on the substrate. Planarizing the spheres exposes a cross-section of each sphere, thereby providing an array of high-quality, crystalline semiconductor islands for device fabrication on a globally planarized surface.

U.S. Pat. No. 4,637,855, incorporated herein by reference, discloses fabricating spheres of silicon on a substrate by applying a slurry of metallurgical grade silicon to the substrate and then patterning the slurry layer to provide regions of metallurgical silicon of uniform size. The substrate is then heated to melt the silicon, which then beads to the surface to form molten spheres of silicon, which are then cooled to crystallize them. The spheres have very weak adhesion to the substrate and are easily detached from the substrate by simply knocking them loose. The loose spheres are collected and undergo further processing.

US 2012/0067273 A1, incorporated herein by reference, discloses fabricating silicon wafers by bringing a substrate into contact with a reservoir of molten silicon, forming a layer of solid silicon on the substrate, and subsequently detaching the solid layer from the substrate. The disclosed method can potentially be used to fabricate silicon wafers with large areas.

SUMMARY OF THE INVENTION

Provided herein is a method of fabricating one or more crystalline islands of an island material abutting a substrate. For each crystalline island, particles of the island material are deposited abutting the substrate, and the substrate and the particles are then heated to melt and fuse the particles to form a respective molten globule. The substrate and the respective molten globules are then cooled to crystallize the molten globules, thereby securing the crystalline islands to the substrate.

This method can allow for fabricating crystalline islands using particulate starting materials. In addition, in some embodiments the crystalline islands being secured to the substrate can allow for further processing of the islands; for example, planarizing at least a portion of each crystalline island to expose a cross-section of each island. If the crystalline islands are sufficiently high-quality crystalline semiconductors, these cross-sections can then be used to fabricate electronic devices. This method can also allow for fabricating arrays of crystalline islands, distributed over an area potentially exceeding the areas of crystalline semiconductor wafers that can be fabricated using traditional boule-based techniques.

According to an aspect of the present invention, there is provided a method of fabricating a crystalline island of an island material, the method comprising depositing particles of the island material abutting a substrate, heating the substrate and the particles of the island material to melt and fuse the particles to form a molten globule, and cooling the substrate and the molten globule to crystallize the molten globule, thereby securing the crystalline island of the island material to the substrate.

The crystalline island can comprise a single crystal of the island material or a polycrystalline form of the island material.

The method can further comprise planarizing at least a portion of the crystalline island to expose a cross-section of the crystalline island.

The securing can comprise the molten globule wetting the substrate at a wetting angle smaller than about 90 degrees and the crystalline island adhering to the substrate.

The depositing can comprise defining a depression in the substrate, and transferring the particles of the island material into the depression.

When the depositing comprises defining a depression and transferring the particles of the island material into the depression, the securing can comprise a portion of a surface of the depression enveloping a portion of a surface of the crystalline island.

When the depositing comprises defining a depression and transferring the particles of the island material into the depression, the depression can be shaped to have at least one vertex.

When the depositing comprises defining a depression and transferring the particles of the island material into the depression, the depression can comprise a first depression, and a second depression within the first depression, the second depression smaller and deeper than the first depression.

When the depositing comprises defining a depression and transferring the particles of the island material into the depression, the transferring can comprise one or more of doctor-blading the particles of the island material into the depression, and electrostatic deposition of the particles of the island material into the depression using a charged pin.

When the depositing comprises defining a depression and transferring the particles of the island material into the depression, the transferring can comprise flowing a suspension onto the substrate and into the depression, the suspension comprising a dispersion of the particles of the island material in a carrier medium, and squeegeeing the suspension located on the substrate outside the depression; and the heating can further comprise eliminating the carrier medium prior to the melting and fusing the particles of the island material.

The cooling can comprise one or more of oxidizing an outer surface of the molten globule, super-cooling the molten globule, and applying a physical impact to the substrate.

The depositing can comprise transferring particles of the island material into a through hole in the substrate.

When the depositing comprises transferring particles of the island material into a through hole in the substrate, pressure can be applied at a second end of the through hole to push the molten globule partially out of a first end of the through hole to form a convex meniscus.

When the depositing comprises transferring particles of the island material into a through hole in the substrate, the securing can comprise a portion of a surface of the through hole enveloping a portion of a surface of the crystalline island.

When the depositing comprises transferring particles of the island material into a through hole in the substrate, the method can further comprise after the cooling to crystallize the molten globule, planarizing a portion of the meniscus to expose a cross-section of the crystalline island.

When the depositing comprises transferring particles of the island material into a through hole in the substrate, a portion of a surface of the substrate outside the through hole and adjacent a first end of the through hole can have a wetting angle with the molten globule of less than about 90 degrees.

The depositing can comprise dispersing the particles of the island material in a carrier medium to create a suspension and transferring the suspension onto the substrate, and the heating can further comprise eliminating the carrier medium prior to the melting and fusing the particles of the island material.

When the depositing can comprise dispersing the particles of the island material in a carrier medium to create a suspension and transferring the suspension onto the substrate, and the heating can further comprise eliminating the carrier medium prior to the melting and fusing the particles of the island material, the transferring can comprise one or more of stamping the suspension onto the substrate, screen printing the suspension onto the substrate, inkjet printing the suspension onto the substrate, and spin-coating the suspension onto the substrate, and lithographically patterning the spin-coated suspension.

The depositing can comprise dispersing the particles of the island material in a carrier medium to create a suspension, forming the suspension into a sheet, causing the sheet to solidify to form a solid sheet, patterning the solid sheet by removing one or more portions of the sheet to form a patterned sheet, and overlaying the patterned sheet on the substrate; and the heating can further comprise eliminating the carrier medium prior to the melting and fusing the particles of the island material.

The molten globule can have a first wetting angle with a first portion of a surface of the substrate in contact with the molten globule, and a second wetting angle with a second portion of the surface of the substrate, the second portion abutting the first portion, and the second wetting angle being greater than the first wetting angle.

An area of the substrate in contact with the molten globule can comprise one or more of one or more guiding protrusions, one or more guiding depressions, and a metallic grid for controlling initiation of crystallization as the molten globule is cooled.

The coefficient of thermal expansion (CTE) of the substrate at a temperature within about 20° C. of the melting point of the island material can match the CTE of the island material at the melting point of the island material.

The island material can comprise silicon.

The substrate can comprise alumina.

The securing can comprise over-coating the crystalline island and the substrate with an over-coating layer to form a stack whereby the crystalline island is sandwiched between the substrate and the over-coating layer.

When the securing comprises over-coating the crystalline island and the substrate with an over-coating layer to form a stack whereby the crystalline island is sandwiched between the substrate and the over-coating layer, the method can further comprise planarizing the stack to expose a cross-section of the crystalline island.

According to a further aspect of the present invention, there is provided a method of fabricating a crystalline island of an island material, the method comprising depositing particles of the island' material on a first substrate, sandwiching the particles of the island material between the first substrate and a second substrate by placing the second substrate adjacent the first substrate, heating the first substrate, the second substrate, and the particles of the island material to melt and fuse the particles to form a molten globule, cooling the first substrate, the second substrate, and the molten globule to crystallize the molten globule, thereby forming the crystalline island of the island material.

The cooling can further comprise one or more of applying a pressure pulse to the molten globule, adding a seed crystal to the molten globule, and super-cooling the molten globule.

The first substrate can have a first area being a portion of a surface of the first substrate that comes into contact with the molten globule, and the second substrate can have a second area being a portion of a surface of the second substrate that comes into contact with the molten globule, and one or more of the first area and the second area can comprise one or more of one or more protrusions, one or more depressions, a metallic grid, for controlling initiation of crystallization as the molten globule is cooled.

DESCRIPTION OF THE DRAWINGS

For a better understanding of the various implementations described herein and to show more clearly how they may be carried into effect, reference will now be made, by way of example only, to the accompanying drawings in which.

DETAILED DESCRIPTION OF THE INVENTION

Figure 1:
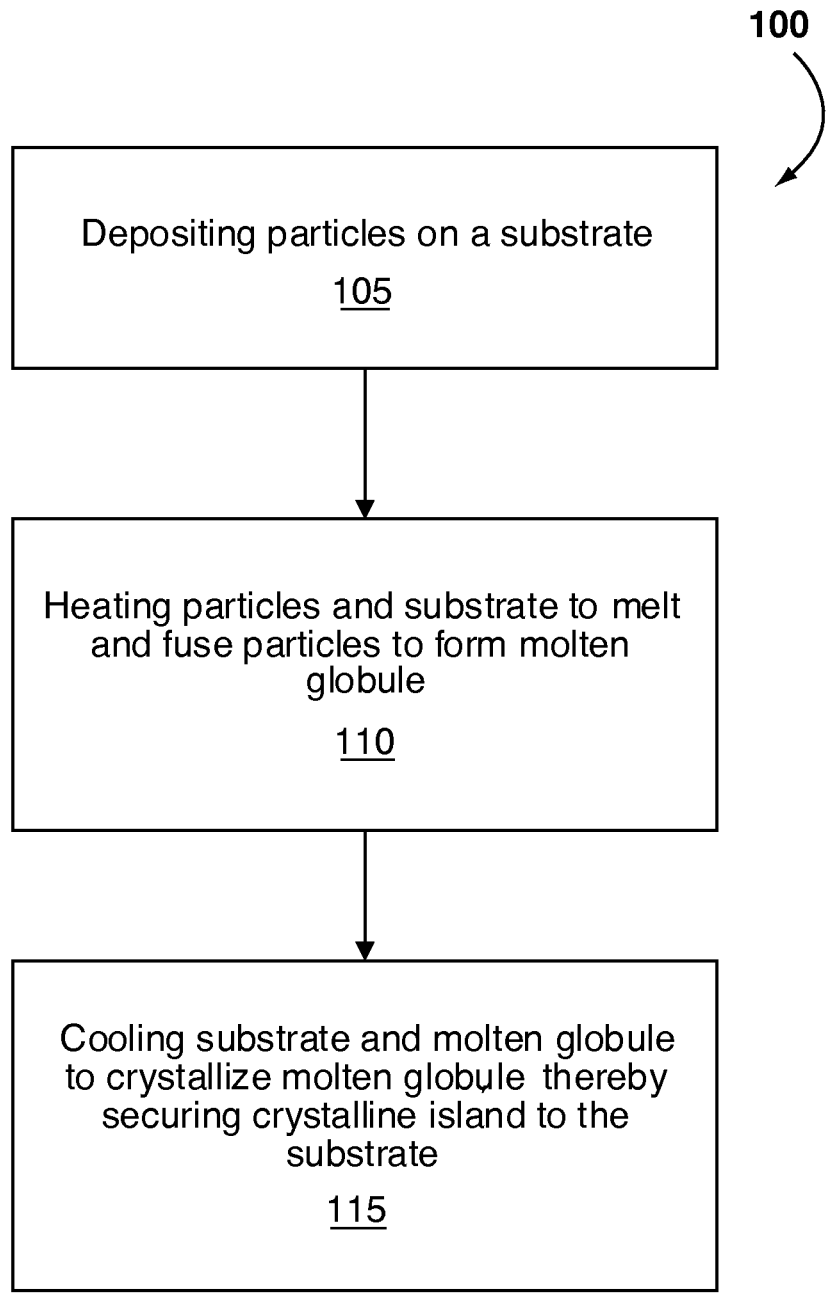
FIG. 1 depicts a method of fabricating a crystalline island abutting a substrate, according to non-limiting implementations.

An embodiment of the present invention is reflected in method 100 shown in FIG. 1. Method 100 can be used to fabricate a crystalline island abutting a substrate, on top of or inside a substrate. First, as shown in box 105, island material can be deposited abutting the substrate, on or in the substrate. The island material can be in particulate form. Particles of the island material can be deposited at a predetermined location relative to the substrate, which can include, but is not limited to, deposition on all or a portion of the surface of the substrate. Particles of the island material can be deposited as a substantially pure powder, a powder with some additives or impurities, or as particles of the island material suspended in a carrier medium. Additives can be used to dope, alloy, or otherwise compound the island material.

Subsequently, as shown in box 110, the substrate and the particles of the island material can be heated. The heating can be by conduction, convection, and/or radiative heating, and can be performed in a furnace, kiln, or other suitable heating apparatus known to the skilled person. The heating melts and fuses the particles of the island material to form a molten globule of the island material. When a carrier medium is used to deposit the island material, the heating can evaporate, burn off, or otherwise eliminate the carrier medium before the melting and fusing of the island material particles. The island and substrate materials can be chosen so that the substrate does not melt at the temperature required to melt and fuse the particles of the island material.

Subsequently, as shown in box 115, the substrate and the molten globule are cooled to crystallize the molten globule, thereby securing the resulting crystalline island to the substrate. In some embodiments, the islands are secured strongly enough to allow mechanical polishing, or other abrasive processing, of the island to expose a cross-section of the island, without dislodging the island from the substrate.

Figure 2:
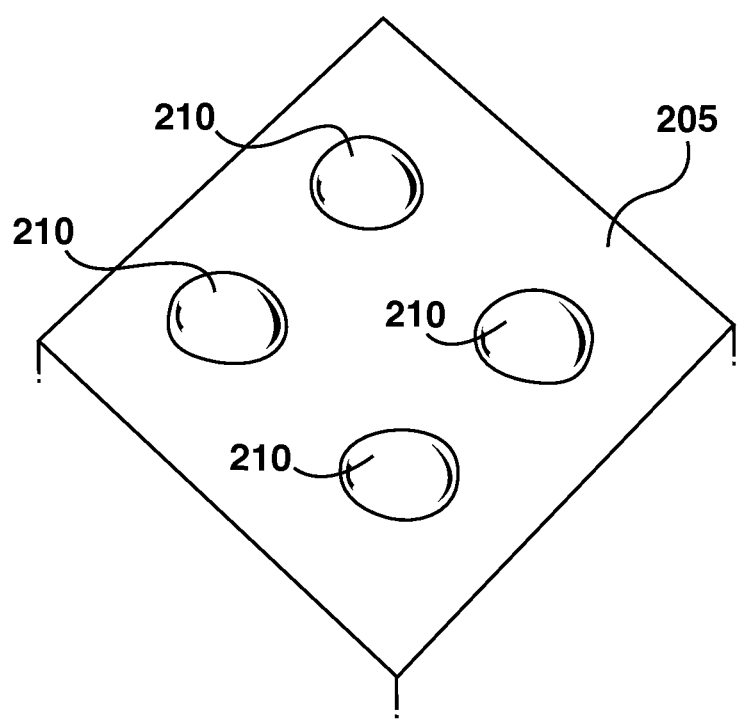
FIG. 2 depicts a top perspective view of crystalline islands on a substrate, according to non-limiting implementations.

FIG. 2 shows an array of crystalline islands 210 formed on substrate 205. Method 100 can be used to fabricate one or any number of crystalline islands. When a plurality of islands is formed, they can be arranged in an ordered array, or can be distributed on the substrate without perceptible periodic ordering. In some embodiments, the position of each island 210 relative to substrate 205 is known to allow for subsequent processing of the islands.

Islands 210 can be single-crystalline or poly-crystalline. Nano-crystalline and amorphous islands can also be formed. In some embodiments after islands 210 are formed, they are planarized, abraded, or otherwise operated upon so that some material is removed from the surfaces thereof to expose a cross-section of each island. This exposed cross-section can then be used to fabricate electronic devices, for example when the islands are formed from a semiconductor such as silicon.

When the starting particulate island material has impurities, the process of melting and crystallizing set out in method 100 can reduce the impurities inside the crystalline islands by pushing the impurities towards the surface of each molten globule as a crystalline lattice begins to form inside the molten globule, a process known as gettering. The lattice then tends to exclude any impurities that would interfere with its ordered arrangement of atoms, thereby excluding at least a portion of the impurities from the inside of the crystal. When the crystalline islands are poly-crystalline, the impurities are pushed to the grain boundaries between the crystals.

Figure 3:
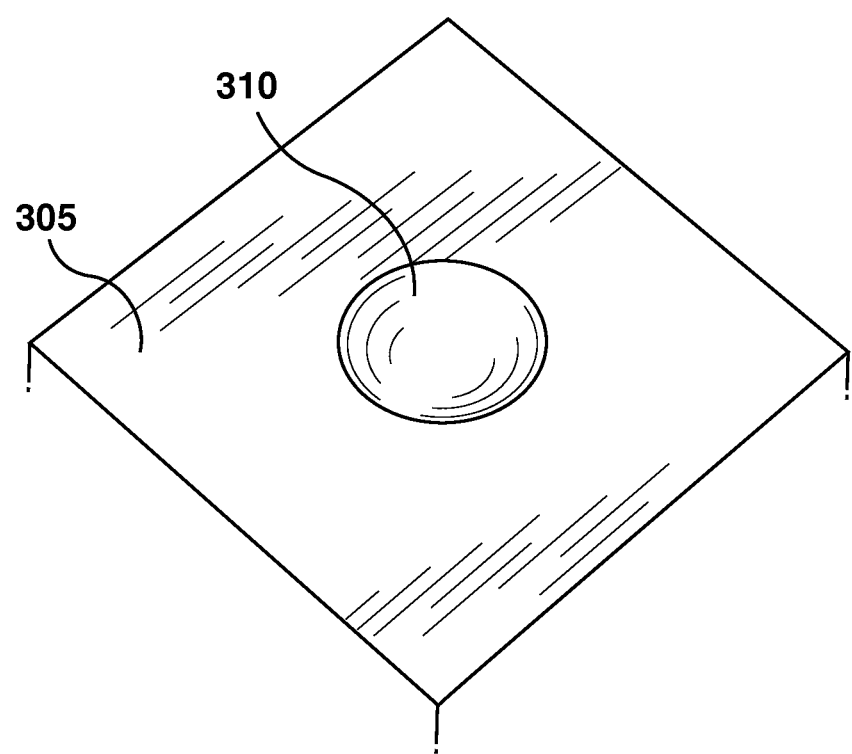
FIG. 3 depicts a top perspective view of a substrate having a depression, according to non-limiting implementations.

In some embodiments, particles of the island material are deposited onto the substrate by transferring the island material into one or more depressions defined in the substrate surface. FIG. 3 shows depression 310 in substrate 305. In some embodiments a plurality of depressions can be defined, and they can be arranged into an ordered array. The depressions can be defined lithographically, or using other means known to the skilled person, including but not limited to laser ablation or localized etching using a photolithographically defined mask.

Figure 4:
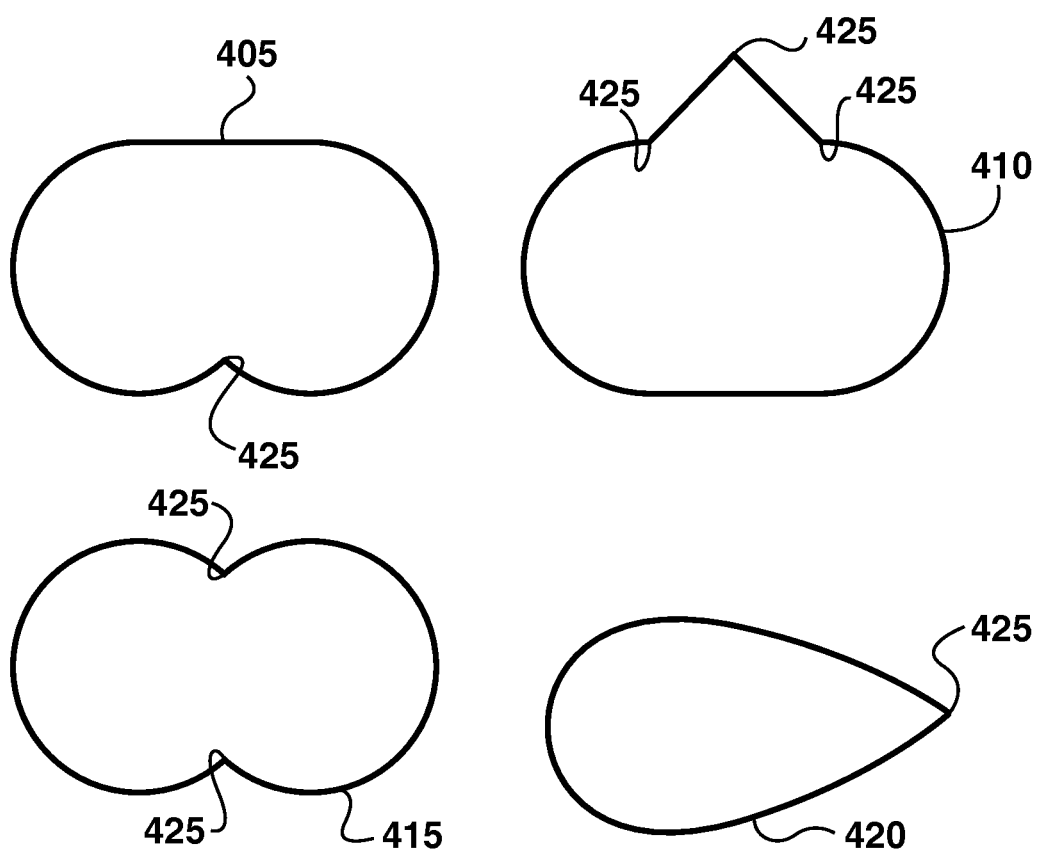
FIG. 4 depicts a collection of possible shapes for a depression, according to non-limiting implementations.

The depression 310 contains the molten globule, and can serve to more precisely locate the molten globule, and the resulting crystalline island, relative to the substrate 305. In addition, the shape of the depression can guide the crystallization process by providing nucleation sites for initiating crystallization. In some embodiments the depression can have one or more vertexes 425 as shown in FIG. 4 in relation to depressions 405, 410, 415, and 420. The vertex 425 can be at the end of a taper such as in the case of depression 420, or part of a reverse taper, as shown in depressions 405 and 415. A depression can have multiple vertexes as shown in depressions 410 and 415. Having multiple nucleation sites in the form of vertexes 425 increases the likelihood for the island being poly-crystalline and decreases the likelihood of formation of a single-crystalline island. Nucleation sites can also be three-dimensional smaller depressions into or protrusions from the surface of depression 310. Such smaller depressions can have one or more vertexes (not shown). These vertexes can in turn serve as a nucleation site for crystallization of the molten globule.

Figure 5:
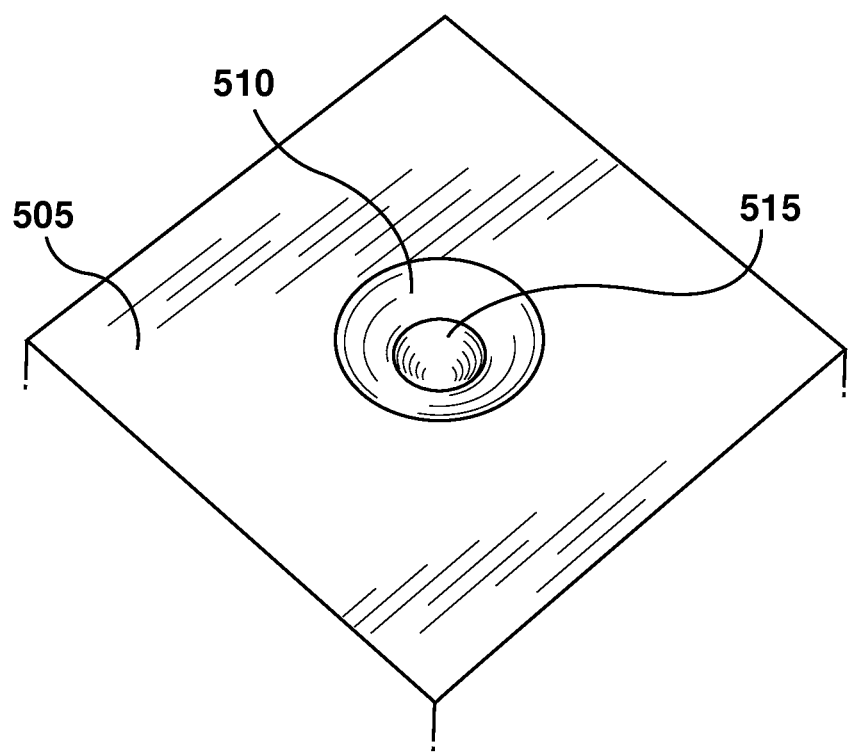
FIG. 5 depicts a top perspective view of a substrate having a depression within a depression, according to non-limiting implementations.

As shown in FIG. 5, in some embodiments, substrate 505 can have a larger and shallower depression 510, within which there can be a smaller and deeper depression 515.

Figure 6A:
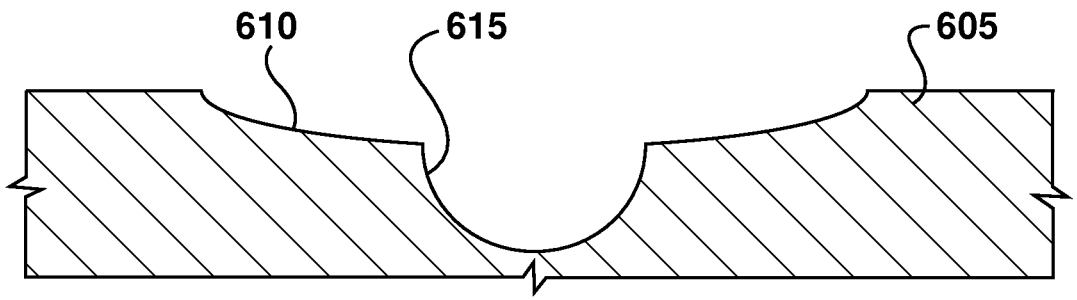
FIGS. 6a-d depict a cross-section of a substrate having a depression within a depression at different stages of forming a crystalline island in the depressions, according to non-limiting implementations.
Figure 6B:
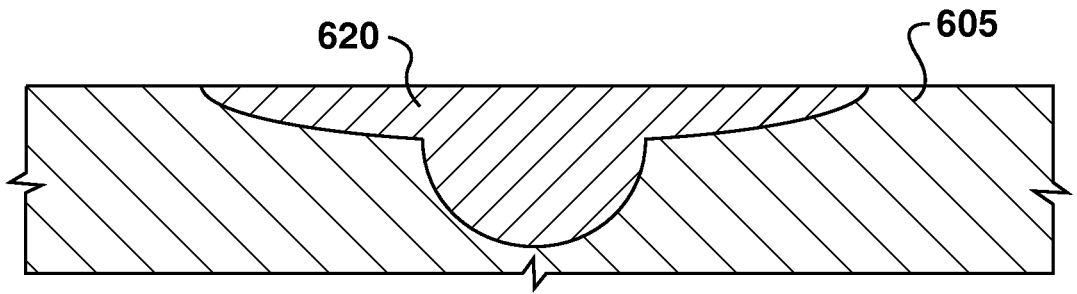
Figure 6C:
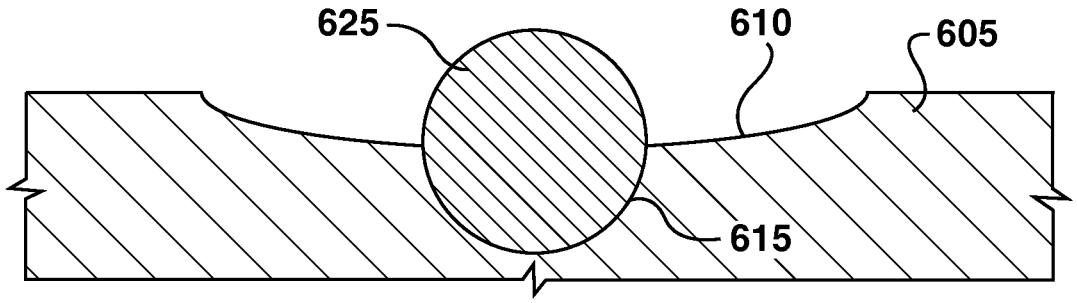
Figure 6D:
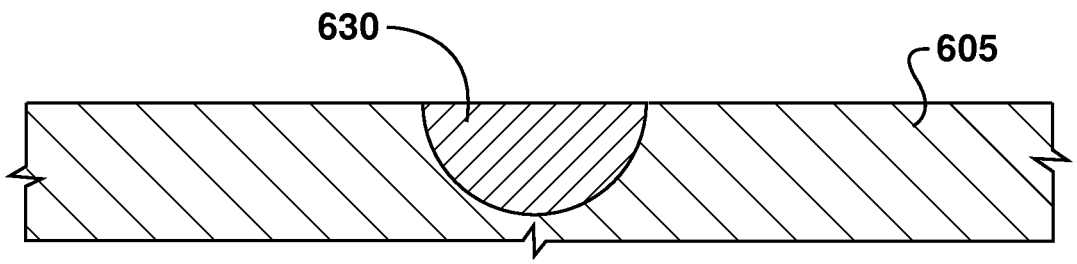

FIGS. 6a-d show a cross-section of a substrate 605, with a larger depression 610 and a smaller and deeper depression 615 within depression 610. As shown in FIG. 6b, particles of the island material 620 can be deposited to fill both the larger and the smaller depressions 610 and 615. As shown in FIG. 6c, when particles 620 are melted, they fuse to form molten globule 625. The surface tension of the molten globule can pull it into an approximately spherical shape, which is then cooled and crystallizes to form a crystalline island. As shown in FIG. 6d, the crystalline island and/or the substrate 605 can be planarized to yield a crystalline island 630 in substrate 605. Depression 610 serves as a reservoir for particles of the island material which eventually form the molten globule 625. Depression 615, in turn, serves to locate the molten globule 625 and initiate its crystallization using vertexes discussed above in relation to FIG. 5.

The relative volume of depressions 610 and 615 can determine the size of the molten globule. This, combined with the depth of depressions 610 and 615 can determine the size of cross-section of crystalline island 630 available at different depths of substrate 605. When particles of island material 620 fuse to form molten globule 625 leaving at least a portion of the volume of depression 610 empty, this empty space can be back-filled after molten globule 625 crystallizes. This back-filling can help to create a planar surface.

Figure 7:
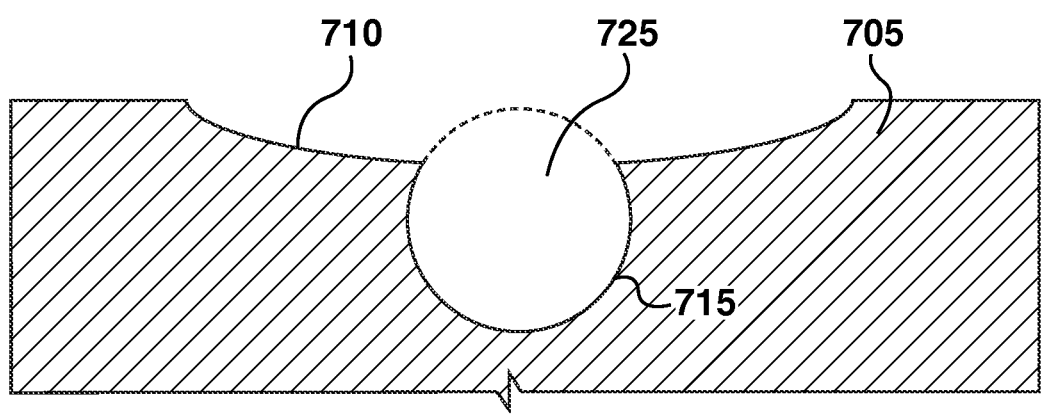
FIG. 7 depicts a cross-section of a substrate having a depression within a depression, according to non-limiting implementations.

FIG. 7 shows a side elevation cross-section of a substrate 705 having large depression 710, and small depression 715 within large depression 710. As shown in the cross-section, the surface of small depression 715 envelops more than half of molten globule 725 (shown in dotted line) thereby physically securing the crystallized molten globule 725 to the substrate. Even in embodiments where the surface of small depression 715 envelops less than half of the molten globule 725, the enveloping can still contribute to physically securing the crystalline island to the substrate. The shape of depression 715 is not limited to a portion of a sphere. Any suitable shape can be used. When it is desirable to physically secure the crystalline island to the substrate, the shape of depression 715 can be used whereby the molten globule can flow into the shape, but the solid crystalline island cannot be physically removed from depression 715. An example of such shapes for depression 715 can be any shape where the opening of depression 715 is smaller than the largest dimension of the crystalline island that must pass through the opening in order for the crystalline island to be removed from depression 715.

Figure 8:
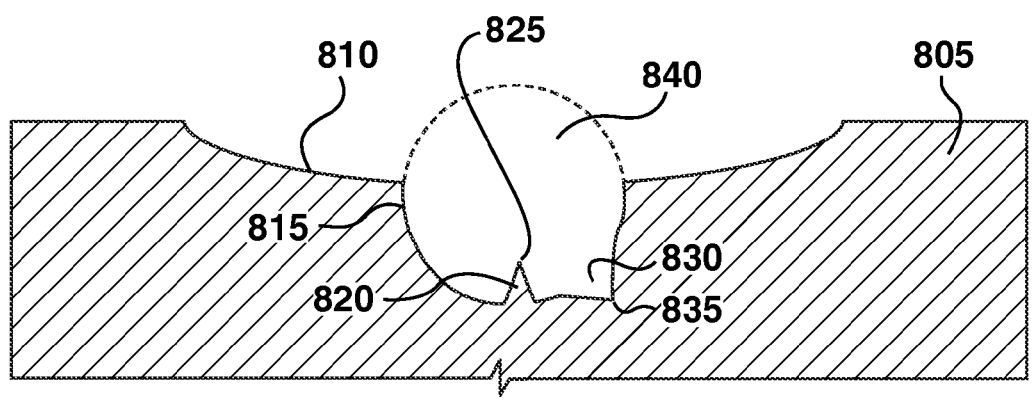
FIG. 8 depicts a cross-section of a substrate having a depression within a depression, according to non-limiting implementations.

FIG. 8 shows a side elevation cross-section of a substrate 805 having a large depression 810 and a small depression 815 within large depression 810. Small depression 815 has protrusion 820 extending into the space to be occupied by molten globule 840. Protrusion 820 can have at least one vertex 825. Instead of, or in addition to, protrusion 820, small depression 815 can have a further depression 830 in the surface of small depression 815. Further depression 830 may have at least one vertex 835. Further depression 830 can also be described as a protrusion of the space to be occupied by molten globule 840 into small depression 815. Depression 815 may have any number or combination of protrusions 820 and further depressions 830. Vertexes 825 and 835 can form a nucleation site for initiating the crystallization of molten globule 840. Once molten globule 840 is crystallized, protrusion 820 and further depression 830 can contribute to physically securing the crystallized island into depression 815, and in turn securing the crystalline island to substrate 805.

The securing means discussed in relation to FIGS. 7 and 8 can also be used in a single-stage depression such as depression 310 shown in FIG. 3. In addition to these means of physically securing the crystalline island to the substrate, surface adhesion can also be used to secure the crystalline island to the substrate. For example, if the molten globule has a wetting angle with the substrate of less than about 90°, the molten globule sufficiently wets the substrate surface and contributes to the adhesion of the crystallized island to the substrate surface.

When the particulate island material is in the form of a loose powder, it can be transferred into the depression in the substrate using means including but not limited to: 1) doctor-blading the powder into the depression; and 2) electrostatically depositing the powder into the depression using charged pins to pick and then deposit the powder into the depression.

When the particulate island material is in the form of a suspension of the particles in a carrier medium, the suspension can be flowed onto the substrate to fill the depression and then squeegeeing the excess suspension located outside the depression from the surface of the substrate. When such a carrier medium is used, during the heating step it can be evaporated, burnt off, or otherwise eliminated before the melting and fusing of the particulate island material.

In the cooling stage, cooling alone can be sufficient to initiate the crystallization of the molten globule. Other techniques can be used to facilitate or more finely control the initiation and progress of the crystallization. For example, the molten globule can be super-cooled below its melting point. Super-cooling can take the form of cooling the molten globule to less than around 300° C. below its melting point before the crystallization starts. Applying a physical impact or shock to the substrate bearing the molten globule can also set off crystallization. This can also be used when the molten globule is super-cooled. In addition, the surface of the molten globule can be exposed to different chemical reactants, such as oxygen, to further guide the crystallization process. The oxygen can form a thin layer or "skin" on the surface of the molten globule which serves to isolate the molten silicon from the substrate and can serve to increase the surface tension of the globule.

Figure 9A:
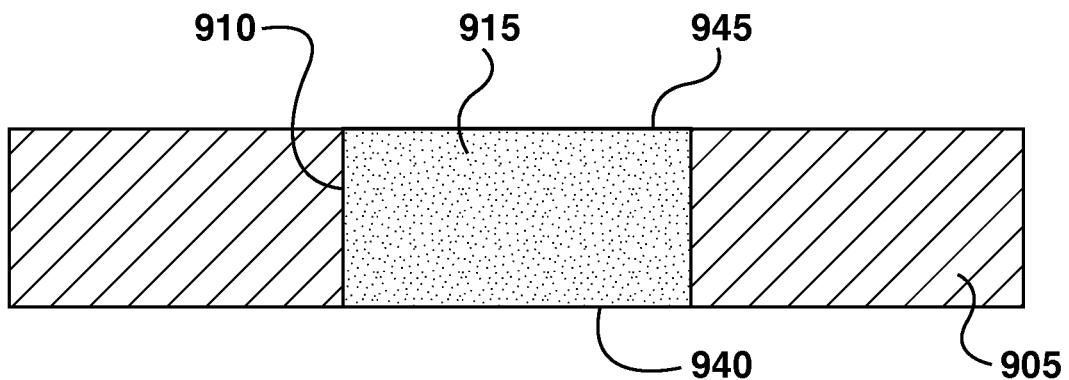
FIGS. 9a-c depict a cross-section of a substrate having a through hole, at different stages of forming a crystalline island in the through hole, according to non-limiting implementations.

FIG. 9a shows an embodiment where substrate 905 has a through hole 910 filled with particulate island material 915. Hole 910 has a first end 940 and a second end 945. Hole 910 can be filled with particulate island material 915 using doctor-blading. Hole 910 can also be filled with a liquid suspension comprising the particulate island material dispersed in a carrier medium. The suspension can be flowed onto the substrate and into hole 910, and then the excess suspension located outside hole 910 can be squeegeed off the surface of the substrate. After filling hole 910, substrate 905 and island material 915 can be heated to melt and fuse the island material into molten globule 935. When such a carrier medium is used, during the heating step it can be evaporated, burnt off, or otherwise eliminated before the melting and fusing of the particulate island material. Optionally, substrate 905 can be flipped before the heating. For example, the flipping can be used when hole 910 has a closed end, to point the open end of hole 910 towards the earth's gravitational force.

Figure 9B:
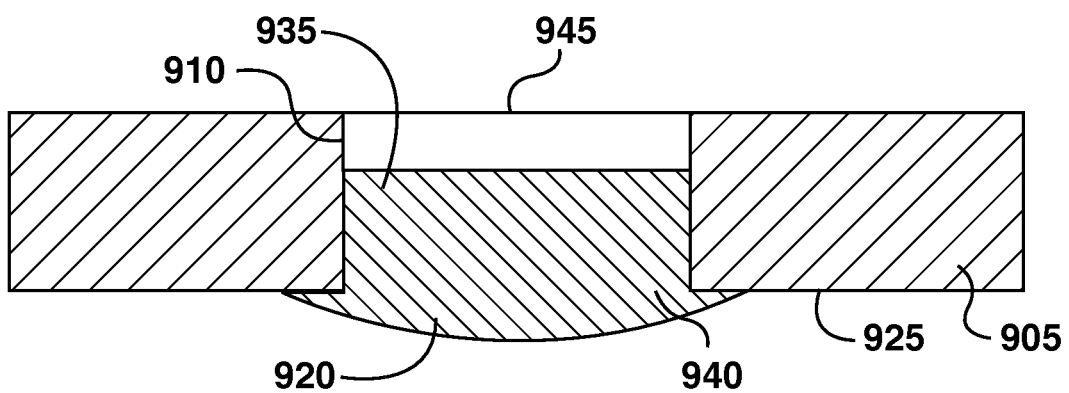
Figure 9C:
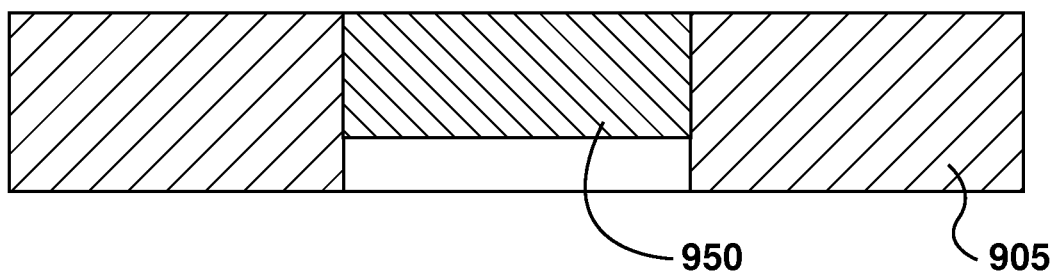

FIG. 9b shows molten globule 935 forming a convex meniscus 920 extending out of the first end 940 of hole 910. Meniscus 920 can form under the force of gravity. In addition, if surface 925 of substrate 905 adjacent first end 940 of hole 910 has a low wetting angle with the molten globule 935, this can encourage the molten globule 935 to wet the surface 925 of substrate 905 and for the meniscus 920 to form and extend out of first end 940 of hole 910. Furthermore, molten globule 930 can be encouraged to extend out of hole 910 and form meniscus 920 if pressure is applied against the molten globule 920 through the second end 945 of hole 910 to push molten globule 920 out of first end 940 of hole 910. As shown in FIG. 9c, once molten globule 935 crystallizes, meniscus 920 can be polished and/or planarized to expose a cross-section of crystalline island 950 and to form a crystalline island 950 in substrate 905.

FIGS. 9a-c show one hole 910, but a plurality of holes can be used. The holes can be arranged in an ordered array. Crystalline islands can be secured to substrate 905 by respective holes, such as hole 910, enveloping and physically securing the respective island 950 and/or the surface adhesion of the crystalline island 950 to the surface of hole 910. Adhesion can be stronger when the wetting angle between the molten globule 935 and the surface of hole 910 is smaller than about 90°.

In another implementation (not shown), particles of island material can be dispersed in a carrier medium to form a suspension. The suspension can then be transferred onto the substrate. Next, the substrate and the suspension can be heated, which can evaporate, burn off, or otherwise eliminate the carrier medium. The heating can also melt and fuse the particles of the island material to form a molten globule. The cooling and securing can be carried on as previously described. A wetting angle of less than about 90° between the molten globule and the substrate can contribute to stronger adhesion between the substrate and crystalline island and to securing the crystalline island to the substrate.

The suspension can be transferred to the substrate using techniques including, but not limited to, one or more of stamping, screen printing, or inkjet printing of the suspension onto the substrate following procedures known in the art. The suspension can also be spin-coated to form a layer on the substrate. This layer can then be lithographically patterned to define one or more regions on the substrate where particles of the island material are present, and other regions where island material particles are absent.

There may not be any depressions in this embodiment. However, the substrate surface can be patterned to have areas of higher wetting angle and other areas of lower wetting angle with the molten globule. The molten globule will tend to form on the areas of lower wetting angle. The patterning of areas with low wetting angle can serve as a means of further locating the molten globule, and thus the crystalline island on the substrate. This can be applied to one crystalline island or a plurality of crystalline islands. Methods for patterning a substrate to have high and low wetting angle areas are well known in the art, and can include applying a patterned mask to the surface followed by subjecting the unmasked areas to chemical modification or deposition of other materials, such as $SiO_2$, on the unmasked areas.

Figure 10:
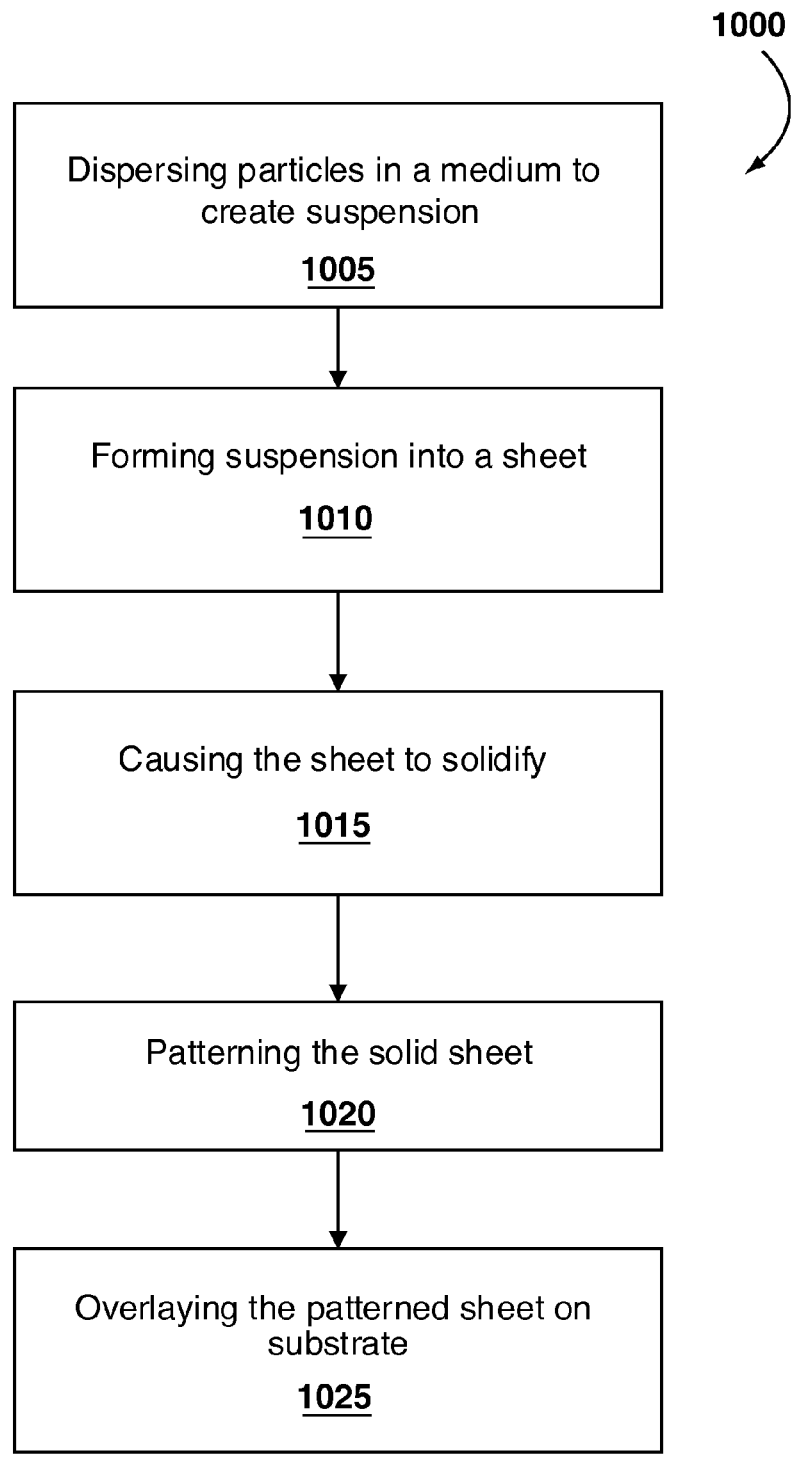
FIG. 10 depicts a method of depositing particles of an island material on a substrate, according to non-limiting implementations.

FIG. 10 shows a further embodiment of the present invention reflected in method 1000 for depositing particles of the island material on the substrate. First, as shown in box 1005, the particles can be dispersed in a carrier medium to create a suspension. Next, as shown in box 1010, the suspension can be formed into a sheet by spreading or spin coating the suspension or using other methods known in the art. Next, as shown in box 1015, the sheet of the suspension can be transformed into a solid sheet. This can be accomplished by drying, baking, cross-linking, or otherwise solidifying the suspension. Next, as shown in box 1020, the solid sheet can be patterned by cutting away or removing one or more portions of the sheet to form a patterned sheet. The pattern can be applied using a mechanical punch, lithographically, or using other means known in the art. Next, as shown in box 1025, the patterned sheet can be overlaid on the substrate.

At this stage the remaining steps of heating and cooling-and-securing can be applied as previously described. During heating, the carrier medium can be evaporated, burnt off, or otherwise eliminated before melting and fusing of particles of the island material. A wetting angle of less than 90° between the molten globule and the substrate can contribute to adhesion of the crystalline island to the substrate. This embodiment can be used to make a single island or a plurality of crystalline islands on the substrate, which can be arranged in an ordered array.

In the embodiments where there is no depression, initiation of the crystallization of the molten globule can still be guided and controlled. One or more guiding depressions into and/or guiding protrusion from the substrate surface coming into contact with the molten globule can initiate crystallization. These guiding depressions and protrusions can have at least one vertex to provide an initiation point for the crystallization process.

Alternatively, the shape of the contact area of the molten globule with the substrate can be controlled to provide an initiation point for crystallization. By patterning the relatively low and high wetting angle areas on the substrate, the molten globule can be made to wet or contact the substrate along a patterned lower wetting angle shape while avoiding the higher wetting angle areas of the substrate. The shape of the low wetting angle area can be any of the shapes discussed above in relation to FIG. 4. The shape can have at least one vertex to provide an initiation point for the crystallization.

Another means of controlling initiation of crystallization can be depositing a metallic grid on the substrate, at least over the areas of the substrate that come into contact with the molten globule. The deposited metal can act as an initiation point for the crystallization of the molten globule. The grid can be made of other materials, such as refractories or Ni. The deposited material can have other shapes such as dots or other patterns of deposited material that may not constitute a grid.

Figure 11:
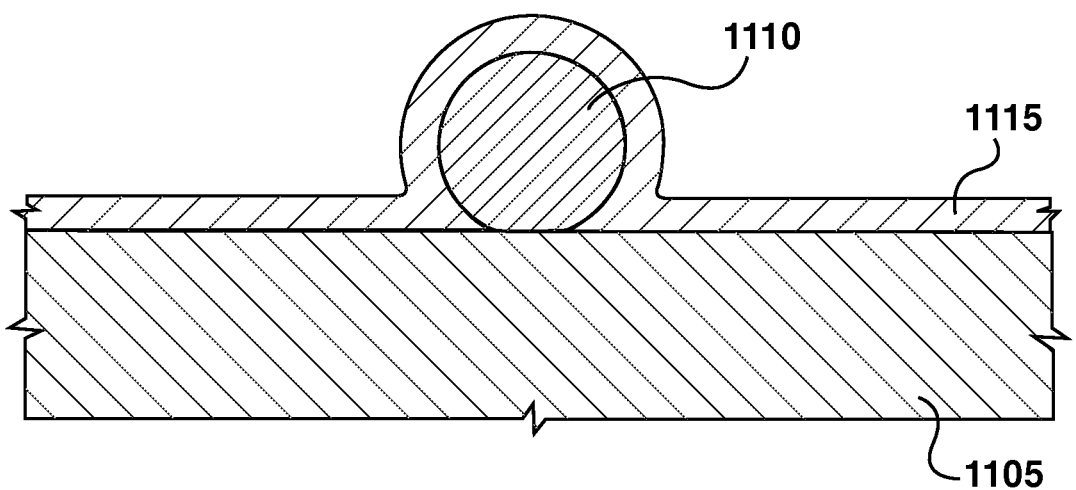
FIG. 11 depicts a cross-section of a crystalline island on a substrate, both over-coated, according to non-limiting implementations.

In other embodiments, after the crystalline islands form, the islands and the substrate can be over-coated. FIG. 11 shows a cross-section of substrate 1105 and crystalline island 1110 over-coated with layer 1115. This assembly forms a stack where the crystalline island 1110 is sandwiched between substrate 1105 and cover-coating layer 1115. The stack can then be planarized to remove some of the material comprising the stack and expose a cross-section of the crystalline island.

Figure 12:
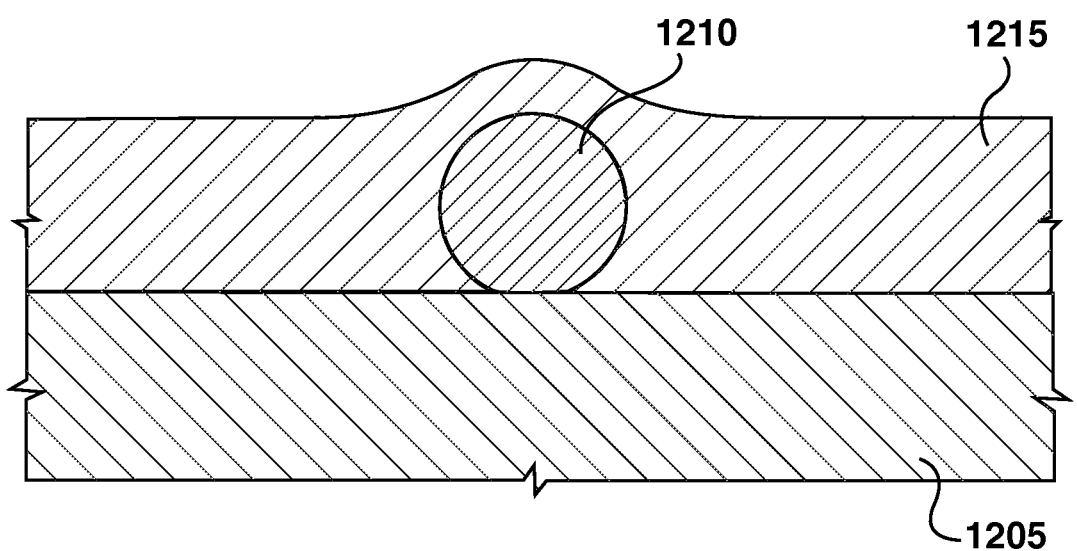
FIG. 12 depicts a cross-section of a crystalline island on a substrate, both over-coated, according to non-limiting implementations.

The over-coating layer 1115 can be deposited using any suitable physical or chemical deposition method including but not limited to spin coating or electrostatically-applied powder coating. The layer can be a thin layer, such as layer 1115 in FIG. 11, or can be a thicker layer such as layer 1215 shown in cross-section in FIG. 12. When an over-coating layer is used, it can physically secure the crystalline island to the substrate by sandwiching the crystalline island between the substrate and the over-coating layer, as shown in FIGS. 11 and 12. This securing action of the over-coating layer can contribute to securing to the substrate crystalline islands having a large wetting angle, and therefore small contact area, with the substrate. Large wetting angles can, for example, be angles greater than about 90°. Over-coating can be applied to a plurality of islands on a substrate.

Figure 13:
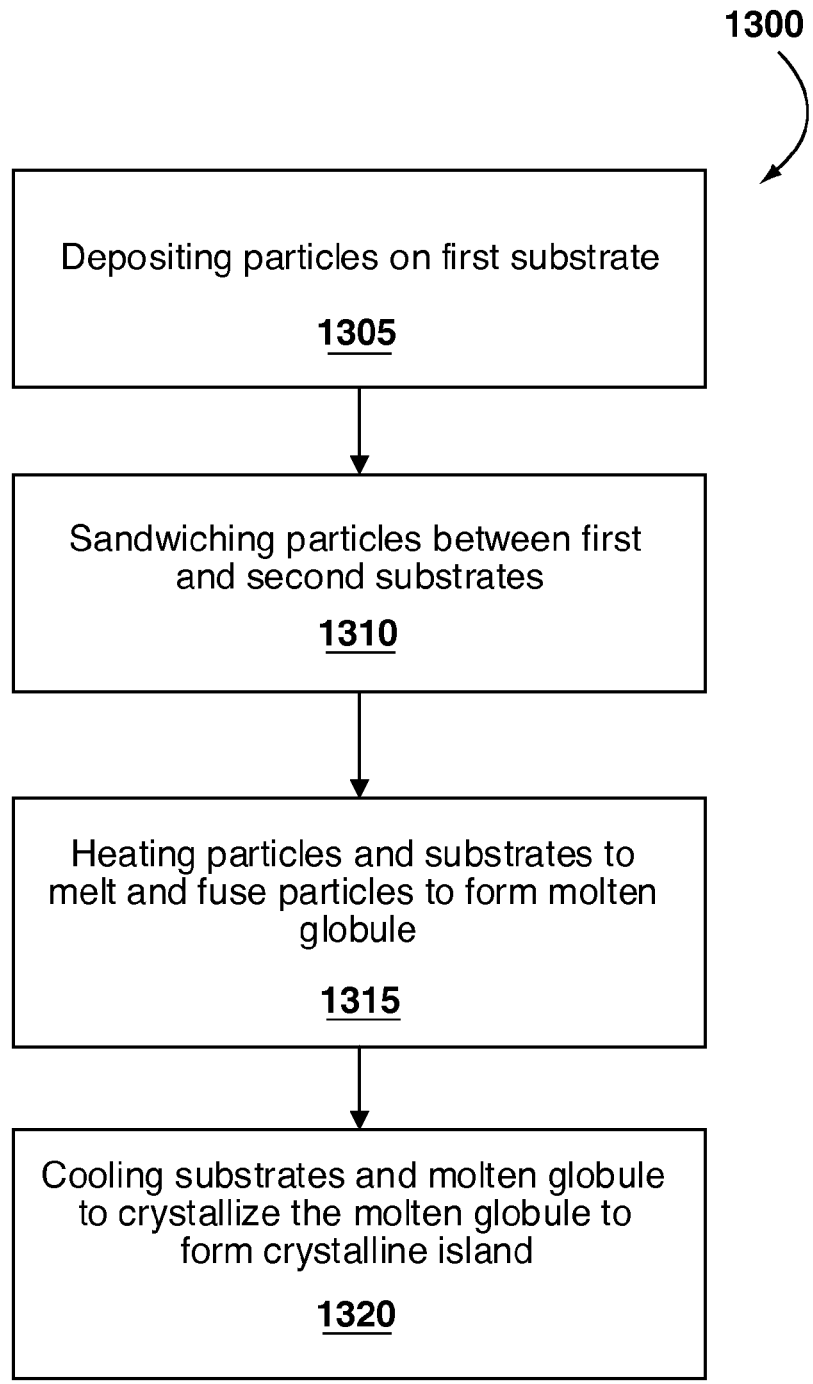
FIG. 13 depicts a method of fabricating a crystalline island sandwiched between two substrates, according to non-limiting implementations.

Another implementation of the present invention is reflected in method 1300 shown in FIG. 13. Box 1305 shows depositing particles of an island material on a first substrate. Particles can be deposited as loose powder or in a suspension as described above. The deposition can be patterned and/or at specified locations relative to the substrate. Next, as shown in box 1310, the particles of the island material can be sandwiched between the first substrate and a second substrate placed adjacent the first substrate. Next, as shown in box 1315, the substrate and the particles can be heated to melt and fuse the particles into a molten globule, without melting the first substrate or the second substrate.

When the particles are deposited as a suspension in a carrier medium, the heating step can evaporate, burn off, or otherwise eliminate the carrier medium before melting and fusing the particles. Next, as shown in box 1320, the substrates and the molten globule can be cooled to crystallize the molten globule, thereby forming a crystalline island.

Figure 14:
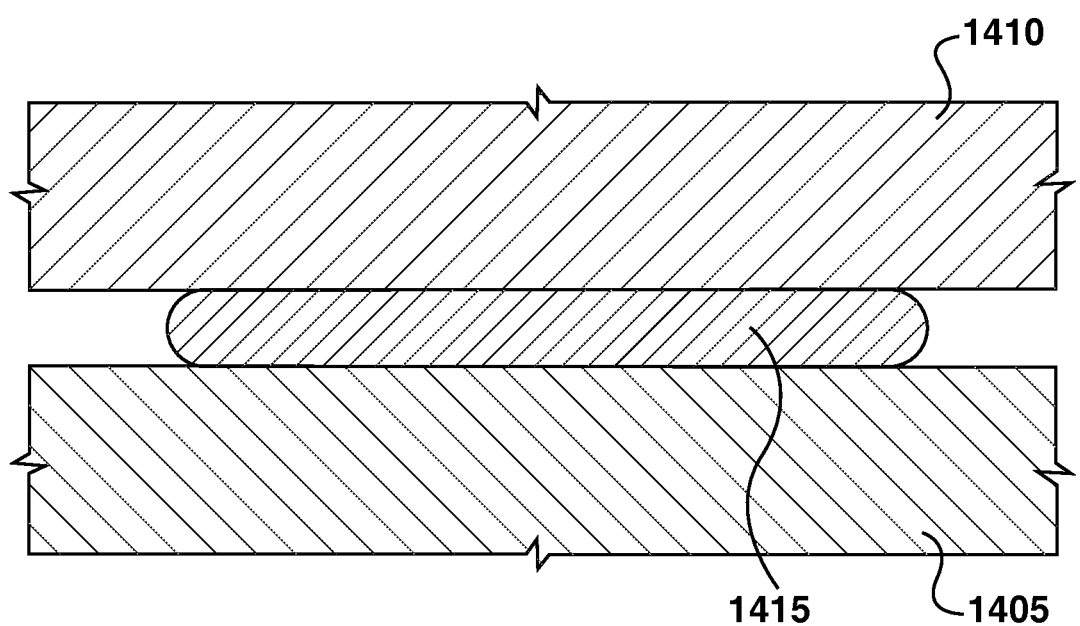
FIG. 14 depicts a cross-section of a molten globule sandwiched between two substrates, according to non-limiting implementations.

The sandwiching, described in box 1310, and the heating described in box 1315 can be performed in the opposite order, i.e. the molten globule can form before it is sandwiched between the first and the second substrates. FIG. 14 shows molten globule 1415 sandwiched between first substrate 1405 and second substrate 1410.

When the wetting angle between molten globule 1410 and both first substrate 1405 and second substrate 1410 is large, the crystallized island can adhere more weakly to the substrate. The weak adhesion can facilitate removing the crystallized island from the substrate to form a free-standing wafer.

Figure 15:
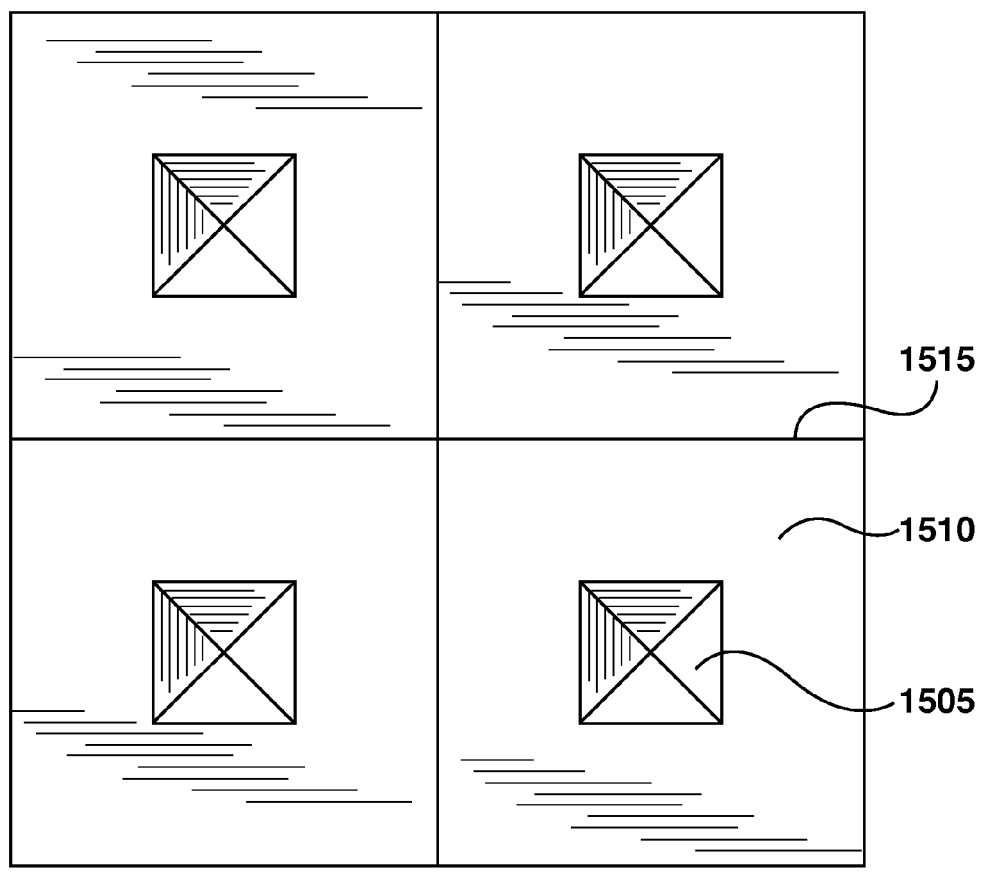
FIG. 15 depicts a top plan view of an array of pyramids and abutting crystal grains on a substrate, according to non-limiting implementations.

Features on the surfaces of one or both of the first and second substrates can be used to initiate crystallization of the molten globule. FIG. 15 shows an array of pyramids 1505 that can be formed on the region of the substrate that comes into contact with the molten globule. Pyramids 1505 can protrude from the substrate surface or form depressions into the substrate surface. Instead of a pyramid, other shapes can be used, such as a cone. These shapes can have a vertex, as does pyramid 1505, to act as an initiation site for the crystallization of the molten globule.

Each pyramid 1505 initiates crystallization to form grain 1510, which eventually abuts upon neighboring grains at grain boundaries 1515. Using this method, a molten globule can be patterned into a poly-crystalline form. As discussed above, during crystallization at least some of the impurities in the molten globule can be pushed towards the grain boundary regions. This process can leave the central region of grain 1510 with relatively fewer impurities yielding a higher quality crystal for post-processing, such as device fabrication on grain 1510. This process can isolate the grain boundaries to regions where devices will not be fabricated in subsequent processing. Although FIG. 15 shows four grains 1510 of uniform size, grains 1510 can also be of different sizes.

Figure 16:
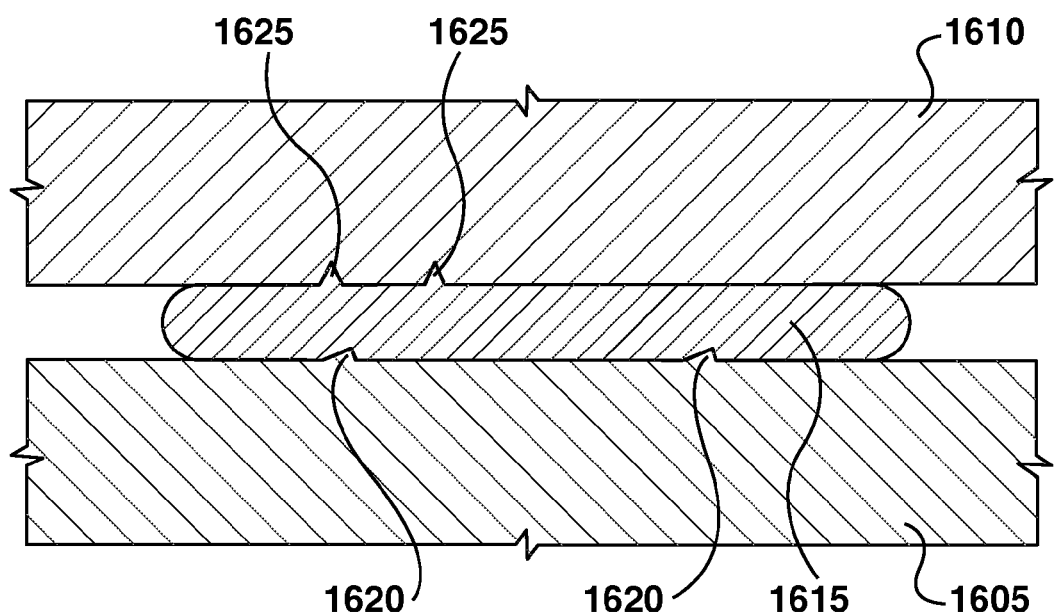
FIG. 16 depicts a cross-section of a molten globule sandwiched between two substrates, according to non-limiting implementations.

FIG. 16 shows a cross-section of molten globule 1615 sandwiched between two substrates 1605 and 1610. As discussed above, one or both of the substrates can include depressions or protrusions to guide the crystallization process. Substrate 1605 can have protrusions 1620 in contact with molten globule 1615. Substrate 1610, in turn, can have depressions 1625 in contact with molten globule 1615. The protrusions 1620 and depressions 1625 can be of different shapes and any numbers of them can be used in/on one or both of first substrate 1605 and second substrate 1610. In addition or instead of protrusions and depressions, a grid or array of a metal or other material deposited on one or both of the first and the second substrate where those substrates come into contact with the molten globule can also be used to initiate and guide the crystallization process.

The cooling as shown in box 1320 of FIG. 13 can also include super-cooling the molten globule. The super-cooling can include cooling the molten globule to a temperature below about 300° C. below its melting point before crystallization begins. A pressure pulse or mechanical impact can also be applied to the molten globule in a super-cooled state or otherwise. A seed crystal can also be added to the molten globule in a super-cooled state or otherwise.

In some embodiments, the coefficient of thermal expansion (CTE) of the substrate at a temperature within about 20° C. of the melting point of the island material can be matched to the CTE of the island material at the melting point of the island material. This matching of CTE can reduce stresses between the island material and the substrate as each one cools and contracts. Lower stresses can facilitate making of higher quality crystals with fewer defects, and can improve the adhesion of the crystalline island to the substrate.

The island material can include, but is not limited to, semiconductors. Such semiconductor can include, but are not limited to, silicon. The substrate material can include, but is not limited to, silica, alumina, sapphire, niobium, molybdenum, tantalum, tungsten, rhenium, titanium, vanadium, chromium, zirconium, hafnium, ruthenium, osmium, iridium, and combinations and alloys of these materials.

The substrate can also be a ceramic or glasses with sufficiently high melting or softening temperatures. The substrate can also be a High-Temperature Co-fired Ceramic (HTCC). HTCC can be worked and mechanically patterned in its green phase. When the island material is silicon, alumina can be a relatively higher wetting angle material and silica a relatively lower wetting angle material.

The above-described embodiments of the invention are intended to be examples of the present invention and alterations and modifications may be effected thereto, by those of skill in the art, without departing from the scope of the invention which is defined solely by the claims appended hereto.

I claim:

1. A method of fabricating a crystalline island of an island material, the method comprising
    depositing particles of the island material abutting a substrate;
    heating the substrate and the particles of the island material to melt and fuse the particles to form a molten globule;
    cooling the substrate and the molten globule to crystallize the molten globule, thereby securing the crystalline island of the island material to the substrate; and
    planarizing at least a portion of the crystalline island to expose a cross-section of the crystalline island.

2. The method of claim 1, wherein the crystalline island comprises a single crystal of the island material or a poly-crystalline form of the island material.

3. The method of claim 1, wherein the securing comprises the molten globule wetting the substrate at a wetting angle smaller than about 90 degrees and the crystalline island adhering to the substrate.

4. The method of claim 1, wherein the depositing comprises:
    defining a depression in the substrate; and
    transferring the particles of the island material into the depression.

5. The method of claim 4, wherein the securing comprises a portion of a surface of the depression enveloping a portion of a surface of the crystalline island.

6. The method of claim 4, wherein the depression is shaped to have at least one vertex.

7. The method of claim 4, wherein the depression comprises:
    a first depression; and
    a second depression within the first depression, the second depression smaller and deeper than the first depression.

8. The method of claim 5, wherein the transferring comprises one or more of:
    doctor-blading the particles of the island material into the depression; and
    electrostatic deposition of the particles of the island material into the depression using a charged pin.

9. The method of claim 4, wherein
    the transferring comprises
        flowing a suspension onto the substrate and into the depression,
        the suspension comprising a dispersion of the particles of the island material in a carrier medium; and
        squeegeeing the suspension located on the substrate outside the depression; and
    the heating further comprises:
        eliminating the carrier medium prior to the melting and fusing the particles of the island material.

10. The method of claim 1, wherein the cooling comprises one or more of oxidizing an outer surface of the molten globule;
    super-cooling the molten globule; and
    applying a physical impact to the substrate.

11. The method of claim 1, wherein:
    the depositing comprises transferring particles of the island material into a through hole in the substrate.

12. The method of claim 11, wherein pressure is applied at a second end of the through hole to push the molten globule partially out of a first end of the through hole to form a convex meniscus.

13. The method of claim 11, wherein the securing comprises
a portion of a surface of the through hole enveloping a portion of a surface of the crystalline island.

14. The method of claim 11, further comprising:
after the cooling to crystallize the molten globule, planarizing a portion of the meniscus to expose a cross-section of the crystalline island.

15. The method of claim 11, wherein a portion of a surface of the substrate outside the through hole and adjacent a first end of the through hole has a wetting angle with the molten globule of less than about 90 degrees.

16. The method of claim 1, wherein:
the depositing comprises:
dispersing the particles of the island material in a carrier medium to create a suspension; and
transferring the suspension onto the substrate; and
the heating further comprises:
eliminating the carrier medium prior to the melting and fusing the particles of the island material.

17. The method of claim 16, wherein the transferring comprises one or more of
stamping the suspension onto the substrate;
screen printing the suspension onto the substrate;
inkjet printing the suspension onto the substrate; and
spin-coating the suspension onto the substrate, and lithographically patterning the spin-coated suspension.

18. The method of claim 1, wherein:
the depositing comprises:
dispersing the particles of the island material in a carrier medium to create a suspension;
forming the suspension into a sheet;
causing the sheet to solidify to form a solid sheet;
patterning the solid sheet by removing one or more portions of the sheet to form a patterned sheet; and
overlaying the patterned sheet on the substrate; and
the heating further comprises:
eliminating the carrier medium prior to the melting and fusing the particles of the island material.

19. The method of claim 1, wherein:
the molten globule has a first wetting angle with a first portion of a surface of the substrate in contact with the molten globule, and a second wetting angle with a second portion of the surface of the substrate, the second portion abutting the first portion, and the second wetting angle being greater than the first wetting angle.

20. The method of claim 1, wherein an area of the substrate in contact with the molten globule comprises one or more of:
one or more guiding protrusions,
one or more guiding depressions, and
a metallic grid,
for controlling initiation of crystallization as the molten globule is cooled.

21. The method of claim 1, wherein the coefficient of thermal expansion (CTE) of the substrate at a temperature within about 20°C. of the melting point of the island material matches the CTE of the island material at the melting point of the island material.

22. The method of claim 1, wherein the island material comprises silicon.

23. The method of claim 1, wherein the substrate comprises alumina.

24. The method of claim 1, where the securing comprises over-coating the crystalline island and the substrate with an over-coating layer to form a stack whereby the crystalline island is sandwiched between the substrate and the over-coating layer.

25. The method of claim 24, further comprising planarizing the stack to expose a cross-section of the crystalline island.

* * * * *